(12) United States Patent
Pirkle et al.

(10) Patent No.: US 7,598,759 B2
(45) Date of Patent: Oct. 6, 2009

(54) ROUTING ENGINE, METHOD OF ROUTING A TEST PROBE AND TESTING SYSTEM EMPLOYING THE SAME

(75) Inventors: Rex W. Pirkle, Denison, TX (US); Sean M. Malolepszy, Sherman, TX (US); Michael W. Perry, Sherman, TX (US); George Reeves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 11/936,689

(22) Filed: Nov. 7, 2007

(65) Prior Publication Data

US 2008/0106286 A1 May 8, 2008

Related U.S. Application Data

(60) Provisional application No. 60/864,717, filed on Nov. 7, 2006.

(51) Int. Cl.
*G01R 31/02* (2006.01)
(52) U.S. Cl. .................. 324/754; 324/765; 702/118
(58) Field of Classification Search ............. 324/754, 324/763, 765, 73.1, 158.1; 438/14–18; 714/733–734; 702/117–119; 716/4–6
See application file for complete search history.

(56) References Cited

U.S. PATENT DOCUMENTS

| 6,872,582 | B2 | 3/2005 | Pirkle et al. |
| 7,071,721 | B2* | 7/2006 | Furukawa ............... 324/765 |
| 7,114,135 | B1* | 9/2006 | Gauvin .................. 716/4 |
| 7,178,078 | B2* | 2/2007 | Hiraide et al. .......... 714/739 |

* cited by examiner

*Primary Examiner*—Ha Tran T Nguyen
*Assistant Examiner*—Arleen M Vazquez
(74) *Attorney, Agent, or Firm*—Yingsheng Tung; Wade J. Brady, III; Frederick J. Telecky, Jr.

(57) ABSTRACT

Embodiments of the present disclosure provide a routing engine, a method of routing a test probe and a testing system employing the router or the method. In one embodiment, the routing engine is for use with a test unit having at least one test probe and includes an analysis unit configured to analyze alternative test probe routing sequences that employ representative circuit chips of a semiconductor wafer to be tested by the test unit. The routing engine also includes a selection unit configured to select at least one of the test probe routing sequences as a test probe path for testing the semiconductor wafer based on a total cost of travel for the test probe path.

24 Claims, 6 Drawing Sheets

ROUTING ENGINE, METHOD OF ROUTING A TEST PROBE AND TESTING SYSTEM EMPLOYING THE SAME

CROSS-REFERENCE TO PROVISIONAL APPLICATION

This application claims the benefit of U.S. Provisional Application No. 60/864,717 entitled "Methods of Prober Travel Optimization in Integrated Circuit Wafer Test and Sampling" to Rex W. Pirkle, Sean M. Malolepszy, Michael W. Perry and George Reeves, filed on Nov. 7, 2006, which is incorporated herein by reference in its entirety.

TECHNICAL FIELD OF THE DISCLOSURE

The present disclosure is directed, in general, to semiconductor wafer testing and, more specifically, to a routing engine, a method of routing a test probe and a testing system employing the engine or the method.

BACKGROUND OF THE DISCLOSURE

In integrated circuit production, current wafer test procedures can be divided into two general classes of operation. These are 100 percent wafer testing and wafer sample testing. Prior to the use of wafer sampling methods, the problem of traversing a 100 percent probed wafer in a reasonable travel cycle was resolved in the straightforward manner of applying a serpentine raster sequence. This serpentine raster sequence is also applied to circuit cell samples of the semiconductor wafer in wafer sample testing. Each of these approaches is typically applied in production testing along the shorter dimension of the semiconductor wafer to reduce the total travel of the test probe. In terms of overall travel, this procedure produces a fairly well planned route with only one edge of the tour in discontinuity, which is the reset path of returning to the starting die location. Although present test approaches provide acceptable results, improvements and greater flexibility in wafer testing would prove beneficial in the art.

SUMMARY OF THE DISCLOSURE

Embodiments of the present disclosure provide a routing engine, a method of routing a test probe and a testing system employing the router or the method. In one embodiment, the routing engine is for use with a test unit having at least one test probe and includes an analysis unit configured to analyze alternative test probe routing sequences that employ representative circuit chips of a semiconductor wafer to be tested by the test unit. The routing engine also includes a selection unit configured to select at least one of the test probe routing sequences as a test probe path for testing the semiconductor wafer based on a total cost of travel for the test probe path.

In another aspect, the present disclosure provides a method of routing a test probe for use with a semiconductor wafer. The method includes analyzing alternative test probe routing sequences that employ representative circuit chips of the semiconductor wafer to be tested by the test probe. The method also includes selecting at least one of the test probe routing sequences as a test probe path for testing the semiconductor wafer based on a total cost of travel for the test probe path and guiding the test probe along the test probe path.

The present disclosure also provides, in yet another aspect, a testing system. The testing system includes a test unit having at least one test probe and a routing engine coupled to the test unit. The routing engine has an analysis unit that analyzes alternative test probe routing sequences by employing representative circuit chips of a semiconductor wafer to be tested by the test unit. The routing engine also has a selection unit that selects at least one of the test probe routing sequences as a test probe path for testing the semiconductor wafer based on a total cost of travel for the test probe path. The testing system also includes a controller that is coupled to the routing engine and guides the test probe along the test probe path.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Embodiments of the present disclosure provide enhanced performance over existing 100 percent probe and "Good Sample Probe" (GSP) test processes through real-time and offline optimizations of wafer probing sequences. These embodiments substantially reduce overall test probe travel and index time. Current methods of full probe, GSP first-pass sampling and progressive stages of "blob analysis" all follow a similar basic procedure. This current procedure produces a serpentine raster travel sequence (a raster scan) for the test probe.

In discussed embodiments, travel distances and therefore travel times are reduced from current serpentine raster travel sequences by employing a heuristic analysis routine prior to passing each set of test coordinates to the test probe. Applications of the heuristic analysis routine of sorting are based on the classical "Traveling Salesman Problem" (i.e., a TSP sorting), which provide non-raster test probe scanning.

Figure 1:
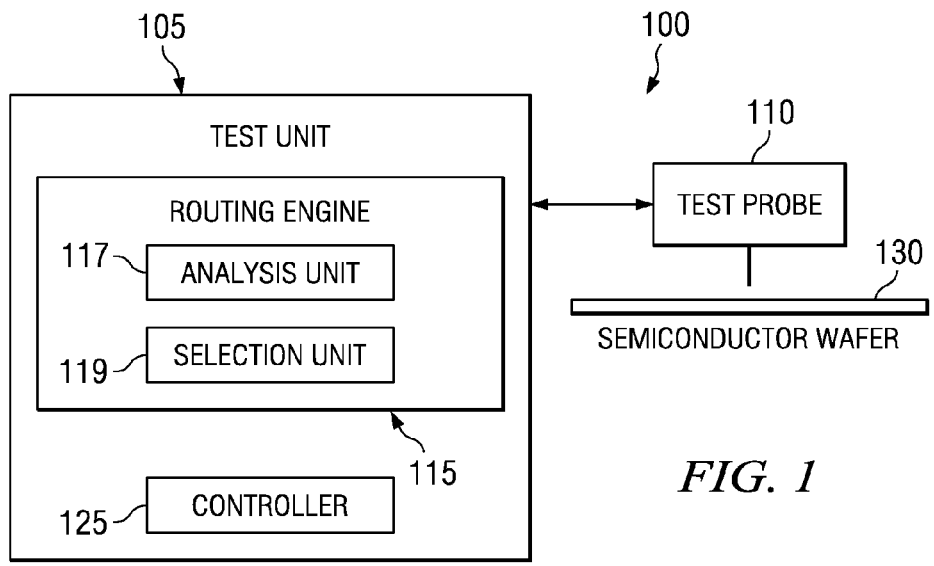
FIG. 1 illustrates a block diagram of a testing system as provided by one embodiment of the disclosure.

FIG. 1 illustrates a block diagram of a testing system 100 as provided by one embodiment of the disclosure. The testing system 100 includes a test unit 105 having at least one test probe 110, a routing engine 115 and a controller 125. The routing engine 115 is coupled to the test unit and includes an analysis unit 117 and a selection unit 119. The testing system 100 may be employed to test a plurality of different types of semiconductor wafers wherein a semiconductor wafer 130 is an example.

The analysis unit 117 analyzes alternative test probe routing sequences by employing representative circuit chips of the semiconductor wafer 130. The selection unit 119 selects at least one of the test probe routing sequences as a test probe path for testing the semiconductor wafer 130 based on a total cost of travel for the test probe path. The controller 125 is coupled to the routing engine 115 and guides the test probe 110 along the selected test probe path.

In one embodiment, a real-time analysis mode is employed for use by the test unit 105. Alternatively, an offline analysis mode may be employed. In addition to employing heuristic analysis routines to establish the test probe path, some embodiments provide a hierarchal test probe path that uses first-pass and second-pass test probe routing sequences. In one embodiment, the first-pass test probe routing sequence may be used to pre-screen a semiconductor wafer. In another embodiment, the second-pass test probe routing sequence provides at least one perimeter-defining test probe path that determines a defective area (such as a blob) on the semiconductor wafer 130.

An adaptation of the Traveling Salesman Problem for the test probe 110 may be stated as follows. The test probe 110 expends its time and capacity visiting a series of test chips. In one test probe path, the test probe 110 tests each chip just once and then returns to a starting location. In what order should the test probe 110 be sequenced to minimize the total cost of travel? (Note that the problem statement is phrased, "total cost of travel" and not "total distance traveled".) This is the case since deriving the "optimal solution" to the overall probe tour is extremely complex for a typical number of test chips encountered thereby requiring a long computation time.

The total cost of travel corresponds to a combination of reducing a travel path length of the test probe that is balanced with a calculation time required to obtain the travel path. Calculation of the actual shortest test probe path may require computation times that are restrictively long for actual test purposes. This is especially true if calculation of the test probe path is accomplished in real time while testing the semiconductor wafer 130.

Therefore, embodiments of the present disclosure generally employ the heuristic approaches that reduce the test probe path without causing the test probe 110 to have to wait on the calculations. This provides the computational transparency required in efficiently testing the semiconductor wafer 130. The total cost of travel provides a figure of merit employed for selection purposes of a calculated length of the test probe path compared to a time required to calculate the test probe path.

Semiconductor wafers that need to be tested offer a wide variety of different types of circuit chips ranging from about 1000 circuit chips per wafer to more than 100,000 circuit chips per wafer. Real-time computation of the test probe path may be limited by available computational capability for higher circuit chip density semiconductor wafers.

In one embodiment of the present disclosure, an offline analysis mode may be employed to produce pre-processed semiconductor sampling maps either for high chip densities or high volume test applications. Since the required computational time is not restrictive of testing time, a more-optimized test probe path may be achieved. This offline approach may also be employed to produce a plurality of alternative test probe routing sequences that may be further adapted during real-time testing to achieve a predetermined total cost of travel required. The real-time and offline analysis modes may also be advantageously used for embodiments employing more than one test probe and multiple test site touch downs on the semiconductor wafer 130.

Figure 2:
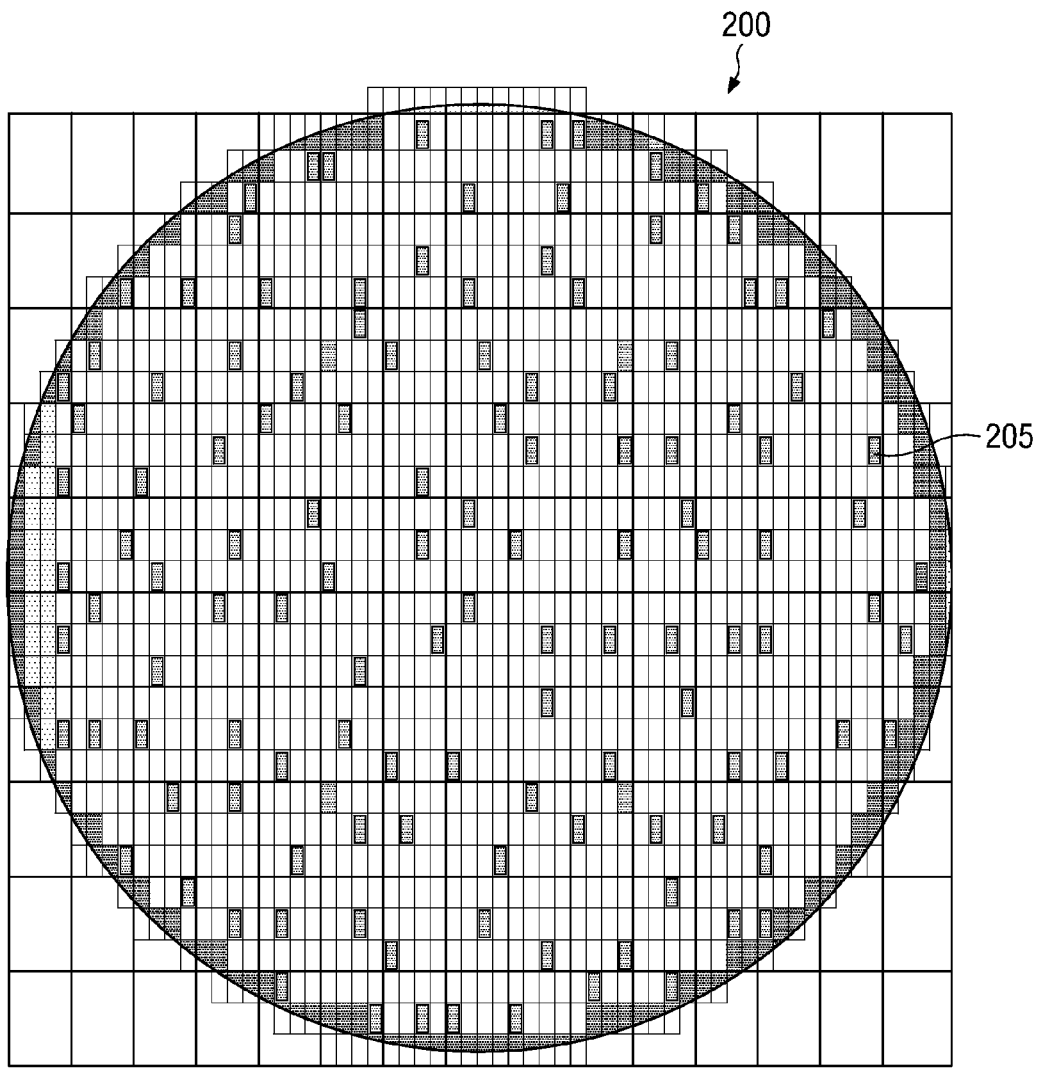
FIG. 2 illustrates a semiconductor wafer showing a representative circuit chip for each of a plurality of three by four circuit chip grid-cell areas.

FIG. 2 illustrates a semiconductor wafer 200 showing a representative circuit chip for each of a plurality of three by four circuit chip grid-cell areas. Each of the representative circuit chips, wherein chip 105 is typical, provides grid-cell based random sampling for testing. The semiconductor wafer 200 may be used to illustrate the complexity of obtaining an exact optimal solution as well as form a basis for showing several different embodiments of solutions employing a heuristic approach.

Generally, if a semiconductor wafer employs a 1:12 random sampling and contains just 600 chips, data has to be gathered from 50 test samples. In a symmetric TSP sorting having n nodes, there are $$\frac{(n-1)!}{2}$$

distinct possible paths to be considered. Therefore, for just 50 test chips, there are over $3.04 \times 10^{62}$ possible combinations of routing paths.

Sampling theory also dictates that in order to maintain a high degree of confidence in the sampling data of a wafer lot, a different set of chip samples is required for each wafer tested. Therefore, a search for the optimal path in every random wafer routing is not cost effective or even practical. The problem grows factorially with the additional of more nodes thereby making discovery of an optimal route for a more complex test problem, such as sampling a wafer with 10,000 chips, beyond practical capability.

Figure 3A:
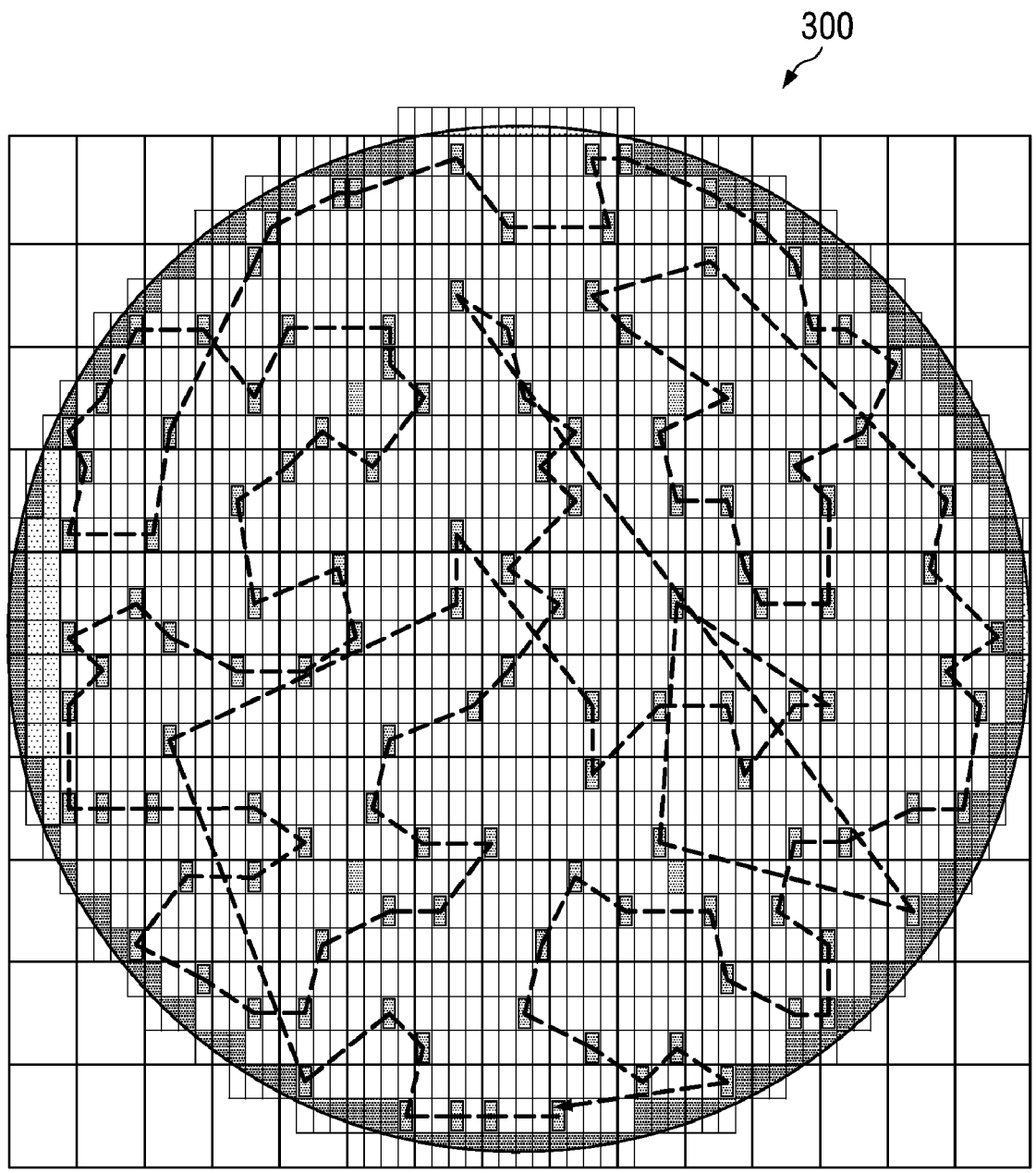
FIGS. 3A, 3B and 3C illustrate embodiments of alternative semiconductor wafer mappings based on heuristic analysis routines of TSP sorting.
Figure 3B:
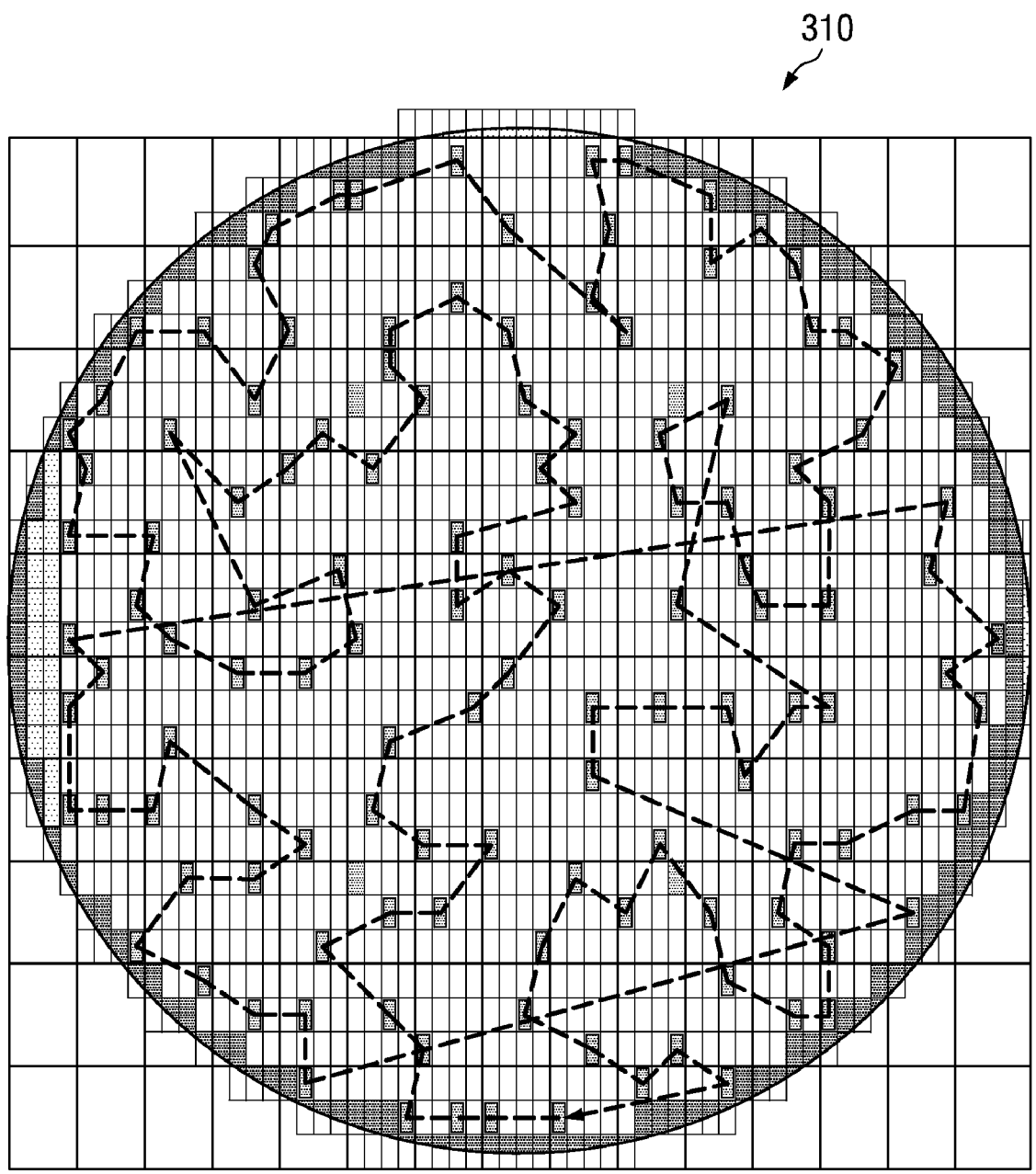
Figure 3C:
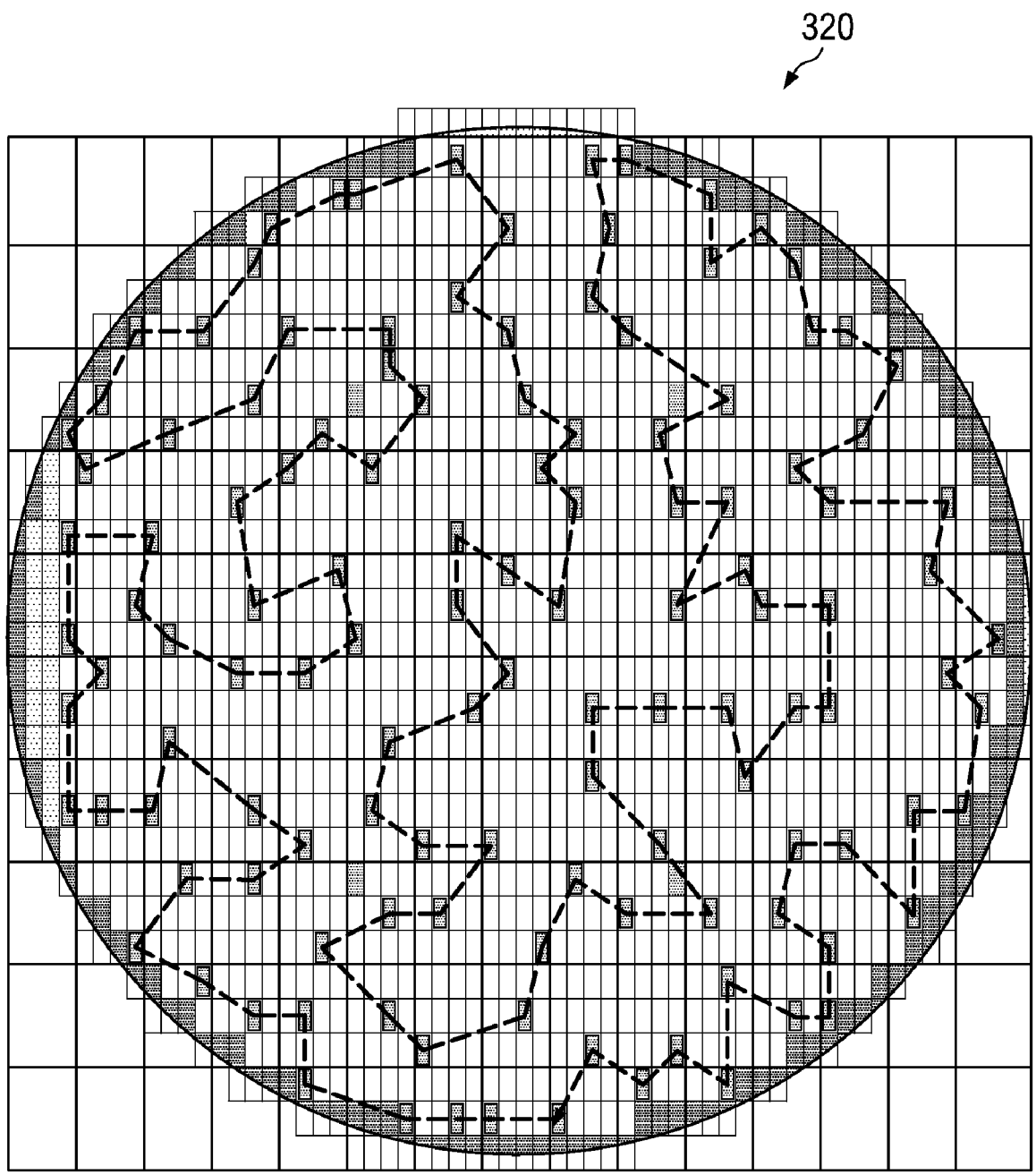

FIGS. 3A, 3B and 3C illustrate embodiments of alternative semiconductor wafer mappings 300, 310, 320 based on heuristic analysis routines of TSP sorting. FIGS. 3A, 3B and 3C show use of a nearest neighbor approach, a greedy path approach and a Lin-Kernighan approach, respectively.

As a baseline, a conventional GSP routing (serpentine raster scan) applied to the example sampling of FIG. 2 produces a test probe path spanning 12,697.6 units in total travel. Using the nearest neighbor approach of FIG. 3A, the test probe path reduces to 6,450.8 units, which provides a 49.2 percent reduction of travel over the conventional GSP routing. The greedy path approach depicted in FIG. 3B provides a slightly better test probe path of 6,247.4 units of travel, which reduces the conventional GSP routing by 50.8 percent. The best test probe path occurs using the Lin-Kernighan solution of FIG. 3C. This approach cuts 59.2 percent from the conventional GSP routing and is 5180.1 units in length. These examples show that even the simplest TSP heuristic approaches will produce a reduced test probe path from that found in the conventional GSP approach.

Case studies show that as a semiconductor wafer diameter grows and chip size shrinks, recoverable travel waste using TSP heuristic approaches grows significantly. Repeated calculations of a sample wafer with a 1:1 aspect ratio and containing a more realistic quantity of 12,000 chips (i.e., approximately 1,000 differing random samples), a TSP solution consistently produced test probe paths having 80 percent reductions over serpentine routings.

GSP sampling may generally require real time path generation for each test wafer, and the TSP approaches discussed above are well suited to the task. For example, a routing solution employing the Lin-Kernighan heuristic approach of FIG. 3C was provided in approximately three seconds (e.g., a Delaunay triangulation sparse edge set/Greedy starting path). Based on experimentation, this type of results for even the most difficult test probe routing problem may be obtained in a majority of cases.

Using the yield information obtained in a first-pass sampling, GSP may make dynamic decisions on how to proceed with probe testing on a wafer-by-wafer basis. Aside from various enhancements that influence specific cases, GSP decides among the three basic modes of scrap, GSP 100 percent test, and blob analysis. If sampling results determine yield is grossly abnormal, TSP sorting will result in the test probe path indicated in FIG. 3D, and the test wafer will scrap. For such occasions GSP minimizes testing, and TSP routing hastens the conclusion.

Although not specifically shown in the examples of FIGS. 3A, 3B and 3C, the test probe path may employ a set of test probe routing subsequences that respectively correspond to a set of different test areas on the semiconductor wafer. For example, the semiconductor wafer may be divided into approximately four quadrants wherein each quadrant has its own portion of the test probe path. These portions may be developed independently for each of the test area quadrants thereby reducing an overall computational complexity. This provides a "divide and conquer" approach that may be particularly useful for semiconductor wafers having a large number of test samples.

Figure 4A:
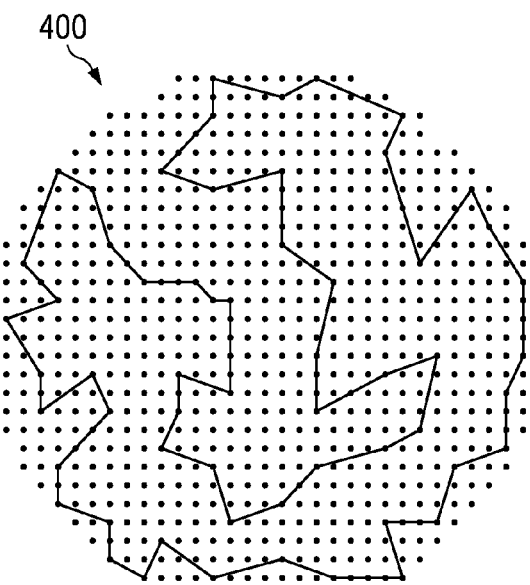
FIGS. 4A and 4B illustrate an embodiment of a hierarchal test probe path for a semiconductor wafer having a first-pass test probe routing sequence and second-pass test probe routing sequence, respectively.
Figure 4B:
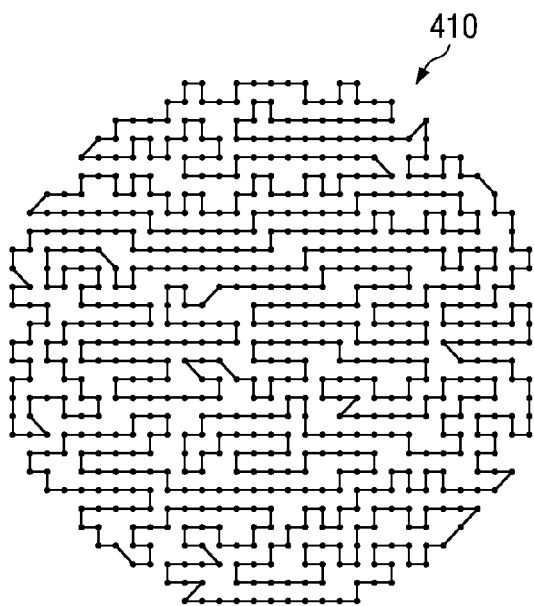

FIGS. 4A and 4B illustrate an embodiment of a hierarchal test probe path for a semiconductor wafer having a first-pass test probe routing sequence 400 and second-pass test probe routing sequence 410, respectively. FIGS. 4A and 4B show how TSP routing affects the case of a GSP decision to perform a 100 percent test on the semiconductor wafer. Unlike a 100 percent raster test, the GSP vacates sample chips from retest and skips the visited first-pass test sites indicated in FIG. 4A in the second-pass testing of FIG. 4B.

Figure 5B:
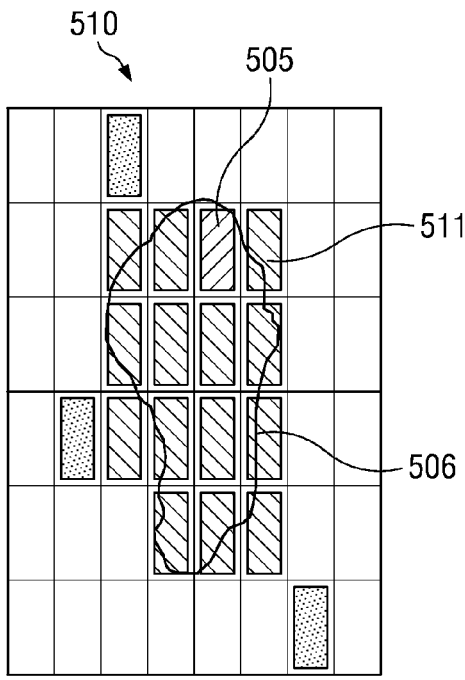
FIGS. 5A, 5B and 5C illustrate detection and further definition of a blob defect employing an embodiment of hierarchal test probe routing sequences.
Figure 5C:
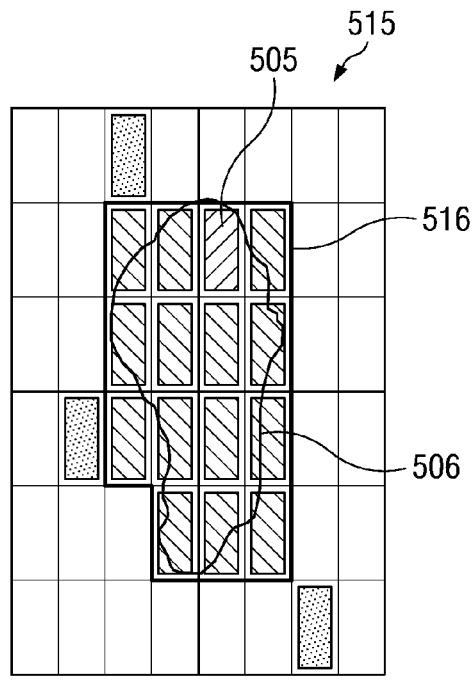
Figure 5A:
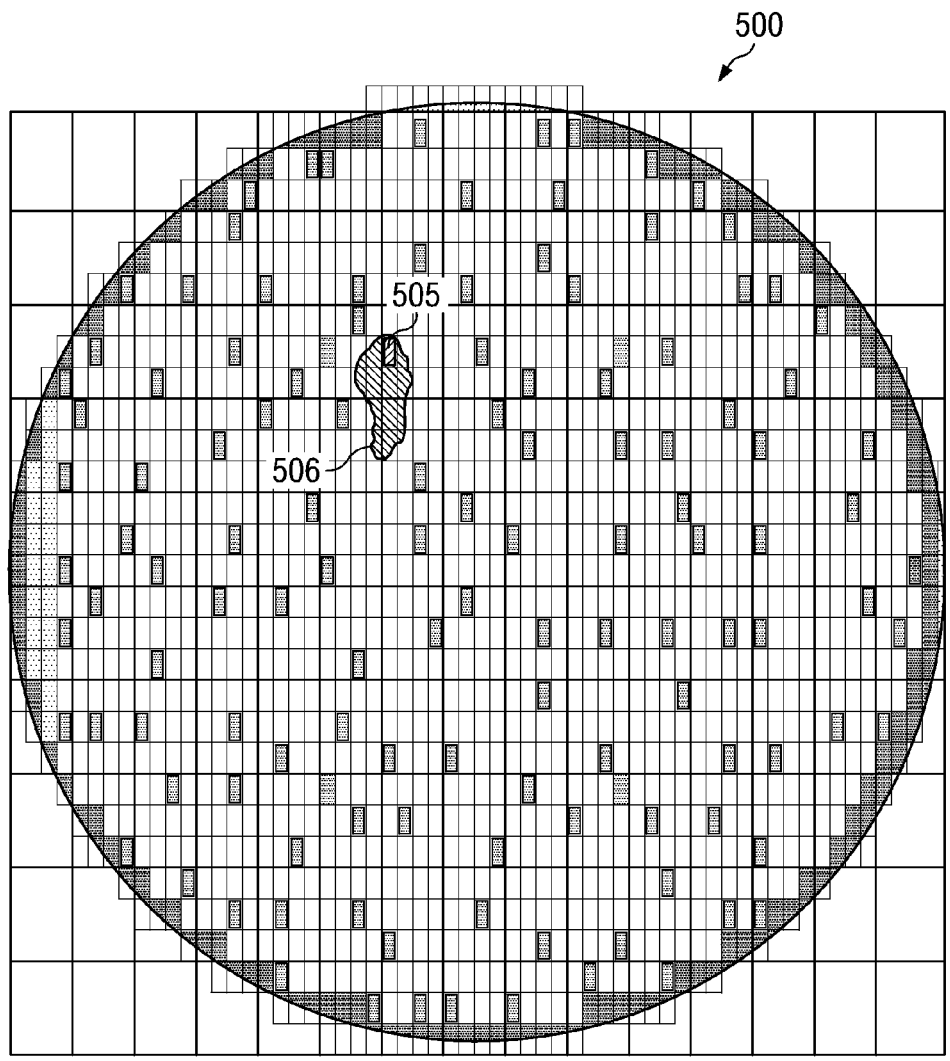

FIGS. 5A, 5B and 5C illustrate detection and further definition of a blob defect employing an embodiment of hierarchal test probe routing sequences. FIG. 5A is a semiconductor wafer 500 showing a blob defect 506 that spans four grid-cell areas and contains a sample circuit chip 505 that was found to be defective in a first-pass test probe routing of the semiconductor wafer 500. The first-pass test probe routing may employ one of the heuristic analysis routines of TSP sorting discussed with respect to FIGS. 3A, 3B, 3C.

FIG. 5B shows a wafer portion 510 of the semiconductor wafer 500 containing the defective sample circuit chip 505 in the blob defect 506. A second-pass test probe routing sequence is employed to define additional defective sample circuit chips impacted by the blob 506. The second-pass test probe routing employs a perimeter-defining sequence involving circuit chips both inside and surrounding the blob 506 that may use heuristic analysis routines, depending on blob size. Circuit chip 511 is representative of the additional defective circuit chips detected by the second-pass test probe routing. A defect area perimeter 516 is shown in a wafer portion 515 of FIG. 5C wherein the interior circuit chips are know to be defective and may be quarantined to avoid further use.

An extension of TSP routing concepts may also encompass wafer-inking operations. Ink dots are occasionally used to physically mark rejected chips, or to grade chips into differing classifications. In this process, coordinate locations designated for inking by test mapping, (such as rejects, partial die, edge-band chips, etc.) may be sorted by a TSP algorithm to produce an inking sequence. As in the test probe operation, a most advantageous path typically results by this approach. Due to the advent of inkless wafer mapping, this operation is waning in importance, but some use persists because an inkless mode is occasionally unsupported in assembly.

Figure 6:
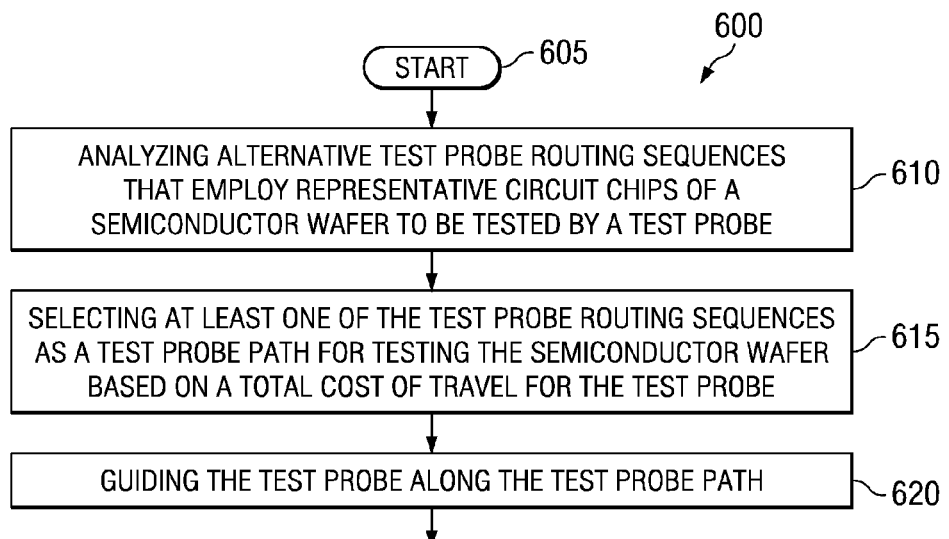
FIG. 6 illustrates an embodiment of a method of routing a test probe carried out according to the principles of the present disclosure.

FIG. 6 illustrates an embodiment of a method 600 of routing a test probe carried out according to the principles of the present disclosure. The method 600 is for use with a semiconductor wafer and starts in a step 605. Then, alternative test probe routing sequences are analyzed that employ representative circuit chips of the semiconductor wafer to be tested by the test probe in a step 610. Generally, each of the representative circuit chips corresponds to a sample chosen from a grid-cell area of N circuit chips by M circuit chips on the semiconductor wafer. In one embodiment, the grid-cell area corresponds to three circuit chips by four circuit chips.

In one embodiment, a mode for analyzing the alternative test probe routing sequences may be provide as a real-time analysis while the semiconductor wafer is being tested. Alternatively, the mode for analyzing the alternative test probe routing sequences may be provided offline to testing. The offline analysis mode typically allows more computational time to be employed in the heuristic development of routing sequences. This may be particularly advantageous for large quantity wafers or those having large chip counts. In either the real-time or offline analysis mode, the alternative test probe routing sequences may be based on a semiconductor wafer mapping of the representative circuit chips that employs a nearest neighbor approach, a greedy path approach or a Lin-Kernighan approach.

At least one of the test probe routing sequences is selected as a test probe path for testing the semiconductor wafer based on a total cost of travel for the test probe path, in a step 615. The total cost of travel is a figure of merit that balances a length of the test probe path with a computational time required to provide the length. Generally, the test probe path is hierarchal and employs first-pass and second-pass test probe routing sequences.

In one embodiment, the second-pass test probe routing sequence provides at least one perimeter-defining test probe path that determines a defective area on the semiconductor wafer. In another embodiment, the test probe path is a set of test probe routing subsequences that respectively correspond to a set of different test areas on the semiconductor wafer. The test probe is guided along the test probe path in a step 620, and the method 600 ends in a step 625.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. A routing engine for use with a test unit having at least one test probe, comprising:
    an analysis unit configured to analyze alternative test probe routing sequences that employ representative circuit chips of a semiconductor wafer to be tested by the test unit; and
    a selection unit configured to select at least one of the test probe routing sequences as a test probe path for testing the semiconductor wafer based on a total cost of travel for the test probe path.

2. The engine as recited in claim 1 wherein a mode for analyzing the alternative test probe routing sequences is selected from the group consisting of:
 a real-time analysis mode; and
 an offline analysis mode.

3. The engine as recited in claim 1 wherein the alternative test probe routing sequences are based on a semiconductor wafer mapping of the representative circuit chips that employs one selected from the group consisting of:
 a nearest neighbor approach;
 a greedy path approach; and
 a Lin-Kernighan approach.

4. The engine as recited in claim 1 wherein each of the representative circuit chips corresponds to a sample chosen from a grid-cell area of N circuit chips by M circuit chips on the semiconductor wafer.

5. The engine as recited in claim 4 wherein the grid-cell area corresponds to three circuit chips by four circuit chips.

6. The engine as recited in claim 1 wherein the test probe path is a set of test probe routing subsequences that respectively correspond to a set of different test areas on the semiconductor wafer.

7. The engine as recited in claim 1 wherein the test probe path is hierarchal and employs first-pass and second-pass test probe routing sequences.

8. The engine as recited in claim 7 wherein the second-pass test probe routing sequence provides at least one perimeter-defining test probe path that determines a defective area on the semiconductor wafer.

9. A method of routing a test probe for use with a semiconductor wafer, comprising:
 analyzing alternative test probe routing sequences that employ representative circuit chips of the semiconductor wafer to be tested by the test probe;
 selecting at least one of the test probe routing sequences as a test probe path for testing the semiconductor wafer based on a total cost of travel for the test probe path; and
 guiding the test probe along the test probe path.

10. The method as recited in claim 9 wherein a mode for analyzing the alternative test probe routing sequences is selected from the group consisting of:
 a real-time analysis mode; and
 an offline analysis mode.

11. The method as recited in claim 9 wherein the alternative test probe routing sequences are based on a semiconductor wafer mapping of the representative circuit chips that employs one selected from the group consisting of:
 a nearest neighbor approach;
 a greedy path approach; and
 a Lin-Kernighan approach.

12. The method as recited in claim 9 wherein each of the representative circuit chips corresponds to a sample chosen from a grid-cell area of N circuit chips by M circuit chips on the semiconductor wafer.

13. The method as recited in claim 12 wherein the grid-cell area corresponds to three circuit chips by four circuit chips.

14. The method as recited in claim 9 wherein the test probe path is a set of test probe routing subsequences that respectively correspond to a set of different test areas on the semiconductor wafer.

15. The method as recited in claim 9 wherein the test probe path is hierarchal and employs first-pass and second-pass test probe routing sequences.

16. The method as recited in claim 15 wherein the second-pass test probe routing sequence provides at least one perimeter-defining test probe path that determines a defective area on the semiconductor wafer.

17. A testing system; comprising:
 a test unit having at least one test probe;
 a routing engine coupled to the test unit, including:
  an analysis unit that analyzes alternative test probe routing sequences by employing representative circuit chips of a semiconductor wafer to be tested by the test unit, and
  a selection unit that selects at least one of the test probe routing sequences as a test probe path for testing the semiconductor wafer based on a total cost of travel for the test probe path; and
 a controller that is coupled to the routing engine and guides the test probe along the test probe path.

18. The system as recited in claim 17 wherein a mode for analyzing the alternative test probe routing sequences is selected from the group consisting of:
 a real-time analysis mode; and
 an offline analysis mode.

19. The system as recited in claim 17 wherein the alternative test probe routing sequences are based on a semiconductor wafer mapping of the representative circuit chips that employs one selected from the group consisting of:
 a nearest neighbor approach;
 a greedy path approach; and
 a Lin-Kernighan approach.

20. The system as recited in claim 17 wherein each of the representative circuit chips corresponds to a sample chosen from a grid-cell area of N circuit chips by M circuit chips on the semiconductor wafer.

21. The system as recited in claim 20 wherein the grid-cell area corresponds to three circuit chips by four circuit chips.

22. The system as recited in claim 17 wherein the test probe path is a set of test probe routing subsequences that respectively correspond to a set of different test areas on the semiconductor wafer.

23. The system as recited in claim 17 wherein the test probe path is hierarchal and employs first-pass and second-pass test probe routing sequences.

24. The system as recited in claim 23 wherein the second-pass test probe routing sequence provides at least one perimeter-defining test probe path that determines a defective area on the semiconductor wafer.

* * * * *